United States Patent [19]
Runas

[11] Patent Number: 5,442,588
[45] Date of Patent: Aug. 15, 1995

[54] CIRCUITS AND METHODS FOR REFRESHING A DUAL BANK MEMORY

[75] Inventor: Michael E. Runas, McKinney, Tex.

[73] Assignee: Cirrus Logic, Inc., Fremont, Calif.

[21] Appl. No.: 291,155

[22] Filed: Aug. 16, 1994

[51] Int. Cl.[6] .............................................. G11C 7/00
[52] U.S. Cl. ................................ 365/222; 365/230.03
[58] Field of Search ............. 365/222, 230.03, 189.04, 365/230.04

[56] References Cited

U.S. PATENT DOCUMENTS

| | | | |
|---|---|---|---|
| 4,570,242 | 2/1986 | Nagami | 365/222 |
| 4,608,666 | 8/1986 | Uchida | 365/222 |
| 5,251,178 | 10/1993 | Childers | 365/230.03 |
| 5,329,490 | 7/1994 | Murotani | 365/222 |
| 5,373,475 | 12/1994 | Nagase | 365/230.03 |

*Primary Examiner*—Joseph A. Popek
*Assistant Examiner*—Tan Nguyen
*Attorney, Agent, or Firm*—Winstead Sechrest & Minick

[57] ABSTRACT

Memory circuitry 200 is provided which includes first and second banks of memory cells 201 arranged in rows and columns. A first row decoder 210a is provided for selecting a row in the first bank 201a in response to a row address from a first group of row addresses. A second row decoder 210b is provided for selecting a row in the second bank 201b in response to a row address from a second group of row addresses. Row address circuitry 208/209 is provided for presenting a sequence of row addresses to the row decoders 210 in response to a single row address received at an address port to the memory circuitry 200, the row address circuitry 208/209 presenting only row addresses of the first group in a refresh mode. Refresh circuitry 217 couples the row address circuitry 208/209 with the second row decoder 210b, and in the refresh mode converts a row address in the first group presented by the row address circuitry 208/209 into a row address in the second group for use by the second row decoder 210b.

20 Claims, 2 Drawing Sheets

CIRCUITS AND METHODS FOR REFRESHING A DUAL BANK MEMORY

TECHNICAL FIELD OF THE INVENTION

The present invention relates in general to electronic devices, circuitry and systems and in particular to circuits and methods for refreshing a dual bank memory.

CROSS-REFERENCE TO RELATED APPLICATIONS

The following copending and coassigned United States patent applications contain related material and are incorporated herein by reference:

U.S. patent application Ser. No. 08/291,093, entitled "A Dual Bank Memory And Systems Using The Same," and filed concurrently herewith.

BACKGROUND OF THE INVENTION

Many processing systems, such as numerical and video/graphics data processing systems, operate on sequences or streams of digital data words. For example, a typical graphics/video processing system processes sequences of pixel data words each of which defines the color or gray scale level of a corresponding pixel of a frame of pixels being displayed on a display screen. Normally, the words of pixel data defining a given frame are exchanged between the display controller, the frame buffer memory and the display in the same sequence such words will be required during the refresh of the corresponding pixels on the display screen. In numerical data processing applications, sequences of words of data may be generated, stored in memory and then sequentially retrieved when needed to perform a series of numerical calculations. In each case, it becomes critical that the time required to exchange such sequences of data between the processors and memory be minimized in order to optimize system performance.

Dynamic random access memory devices (DRAMs) are often used in the construction of sequentially accessed memory systems such as those discussed above. These devices typically store bits of data in dynamic storage cells arranged in an array of rows and columns. With this arrangement, the bits composing entire words of data can be stored in and retrieved from adjacent cells in the array—namely in adjacent cells along the same row. Page mode (burst mode) accessing is then typically used to access one or more words from a given row during a single address cycle to improve processing speed. During a DRAM page mode access (either a read or a write), a row address is presented to the device address port and latched in with a row address strobe (RAS) to select a given row in the array. A column address strobe is next presented to the address port and latched in with a column address strobe (CAS) to select a first column thereby allowing access to a first cell (bit) along the selected row. Column decode circuitry (static or dynamic) then increments from the received column address to generate a sequence of column addresses to adjacent columns, thereby allowing access to a sequence or "page" of cells (bits) from the selected row.

The page (burst) length of currently available DRAMs operating the page (burst) mode is partially limited by the available column address space. In other words, the number of bits which can be accessed as a single page is dependent on the number of column addresses which can be generated during a given address cycle. Once the column address space has been exhausted, a new row address must be presented and latched in with the falling edge of RAS (i.e., a new address cycle is initiated). In addition, a precharge must be performed between address cycles (i.e., when RAS is high) which requires additional time. Thus, with each new address cycle an access time penalty is paid.

With any memory system based on DRAMS, data refresh becomes an important consideration. Without periodic refresh, data (i.e., charge) being stored in dynamic memory cells may deteriorate or be lost completely. In the case of dynamic memory systems operating on blocks of data, such as DRAMs operating in a page or burst mode, it often becomes necessary to hold a block of data for a substantial period of time and consequently block refresh becomes necessary. Typically, each DRAM device is placed in a mode where a block are continually refreshed during a data storage period using a counter which generates row addresses by counting for each row from a column address minimum to a column address maximum. With each new row a complete RAS cycle must be performed (i.e. a new row address must be presented and latched in with RAS). With each new RAS cycle an access time penalty is paid.

Thus, the need has arisen for improved memory architectures, circuits and for methods of using the same which provide for the rapid refresh of blocks of data.

SUMMARY OF THE INVENTION

In general, the principles of the present invention provide for the simultaneous refresh of two banks of dynamic memory cells in a dual bank memory system. In particular, the principles of the present invention provide for the construction of a memory system in which a cell in a selected one of the banks may be accessed in a conventional read/write mode and blocks of cells in both memory banks can be refreshed in a refresh mode in response to a single initial column address and a single initial row address.

According to a first embodiment of the present invention, memory circuitry is provided which includes first and second banks of memory cells arranged in rows and columns. A first row decoder is provided for selecting a given row in the first bank in response to a row address taken from a first group of row addresses. A second row decoder is provided for selecting a given row in the second bank in response to a row address taken from a second group of row addresses. Row address circuitry presents a sequence of such row addresses to the row decoders in response to a single row address received at an address port to said memory circuitry, the row address circuitry presenting only row addresses of the first group in a refresh mode. Refresh circuitry couples the row address circuitry with the second row decoder, and in the refresh mode, converts each row address presented by the row address circuitry in the first group into a row address in the second group for use by the second row decoder.

According to a second embodiment of the present invention memory circuitry is provided which includes first and second banks of memory cells arranged in rows and columns, each row associated with a wordline conductor and each column associated with a bitline conductor. A first row decoder is coupled to the wordlines of the first bank for selecting a row in the first bank in response to a row address from a first group of row addresses. A second row decoder is coupled to the wordlines of the second bank for selecting a row in the second bank in response to a row address from a second group of row addresses. Column decoder circuitry is coupled to the bitlines for selecting a column in each of the banks in response to a column address in a read/write mode, the column decoder circuitry deactivated in a refresh mode. Sense amplifier circuitry is coupled to the bitlines of the first and second banks for reading selected row and at a selected column during the read/write mode and refreshing cells along a selected row in the refresh mode. Circuitry is also provided for precharging all the bitlines in each bank during the precharge mode. A column address counter is provided for generating a sequence of column addresses per each row address by incrementing from a first column address to a last column address in response to a clock signal. Column address multiplexer circuitry is provided for presenting to the column decoders an initial column address received from a column address bus and thereafter at least a first column address provided by the column address counter. A row address counter is provided for generating a sequence of the row addresses by incrementing by one in the read/write mode from a first row address to a last row address following access to a cell in a column corresponding to the last column address for that row and in the refresh mode by two from the first row address to the last row address to generate a sequence of row addresses of the first group. Row address multiplexer circuitry presents to the row decoders an initial row address received from a row address bus and thereafter at least a first row address provided by the row address counter. Finally, refresh circuitry couples the row multiplexer with the second decoder, the refresh circuitry in the refresh mode converting each address in the first group into an address in the second group.

According to a further embodiment of the present invention, a memory is provided which includes first and second banks of memory cells arranged in rows and columns, each row associated with a wordline conductor and each column associated with a bitline conductor. A first row decoder is coupled to the wordlines of the first bank for selecting a row in the first bank in response to a row address from a first group of row addresses. A second row decoder is coupled to the wordlines of the second bank for selecting a row in the second bank in response to a row address from a second group of row addresses. Circuitry is provided for precharging at least some of the bitlines during a refresh mode. Sense amplifier circuitry is provided for refreshing each cell associated with a selected wordline and a precharged bitline. A row address counter selectively coupled to the address circuitry generates a sequence of row refresh addresses of the first group by incrementing in the refresh mode by two from a first row address to a last row address. Refresh circuitry selectively coupling the row address counter and the second row decoder converts a row address in said first group in the refresh mode into a row address in the second group by inverting a selected bit.

The principles of the present invention provide for improved memory systems and circuits which provide for the rapid refresh of blocks of data. In particular, these memory systems and circuits allow for entire blocks of memory, or even the entire memory itself, to be refreshed in response to a single received row address and a single received column address.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1-4 of the drawings, in which like numbers designate like parts.

The principles of the present invention will be illustrated within the context of a graphics/video processing system; however, memory architectures, circuits and systems according to these principles may be employed in any one of a number of processing applications, especially in those which operate on sequences of data.

Figure 1:
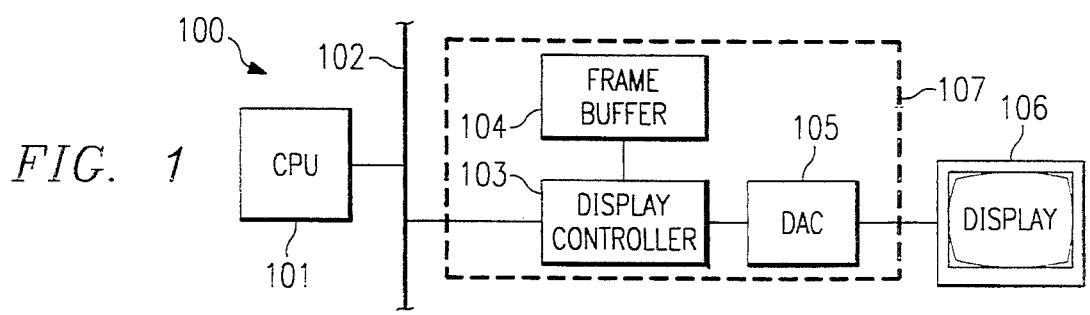
FIG. 1 is a functional block diagram of a typical system employing page mode memory accesses, namely a graphics/video processing system.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may fabricated together on a single integrated circuit chip 107 or on separate chips.

CPU 101 controls the overall operation of system ("master") 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local bus, an ISA bus or a PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. Further, display 106 may be a state-of-the-art device such as a digital micromirror device or a silicon carbide like device (as described in the January 1994 issue of the IEEE *Spectrum*) which directly accepts digital data. It should also be noted that in alternate embodiments, "display" 106 may be another type of output device such as a laser printer or similar document view/print appliances.

Figure 2:
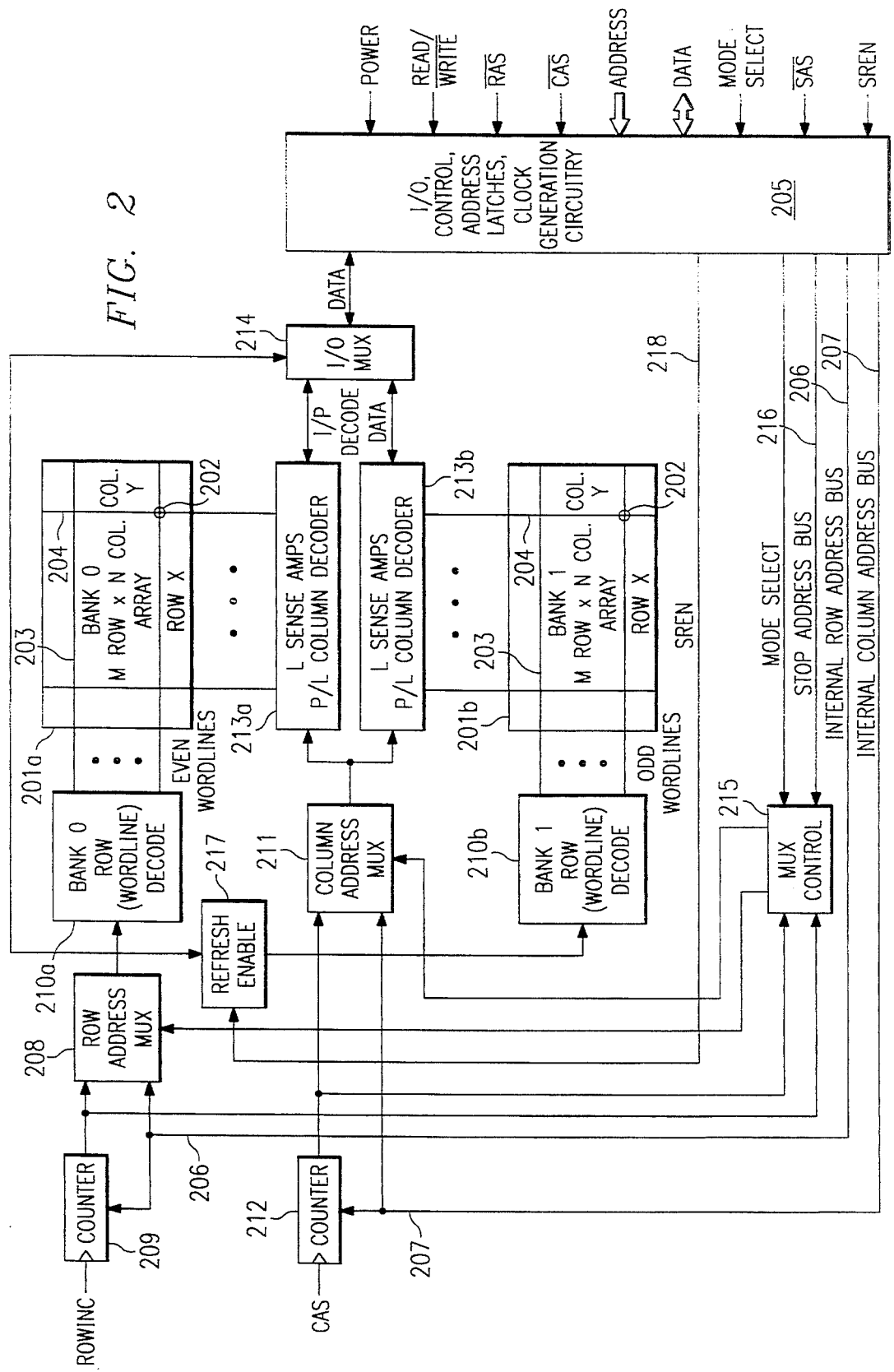
FIG. 2 is a functional block diagram of a dual bank memory embodying the principles of the present invention.

FIG. 2 is a functional block diagram of a dynamic random access memory (DRAM) 200 according to the principles of the present invention. In the system illustrated in FIG. 1, DRAM 200 is used to construct frame buffer 104, however, it should be recognized that DRAM 200 is suitable for wide range of applications, in particular any applications requiring sequential or page (burst) mode accesses. DRAM 200 includes a pair of data banks 201a (Bank 0) and 201b each comprised of a plurality of storage cells 202 arranged in an array of M number of rows and N number of columns. Each row of storage cells 202 is associated with a conductive row line (wordline) 203 and each column of cells is associated with a conductive column line (bitline) 204. A selected cell 202, wordline 203 and bitline 204 is depicted for each bank 201 for reference.

Control circuitry 205 controls the input and latching of addresses, the exchange of data with circuits and devices external to memory 200, power input and distribution, the input of control signals such as RAS, CAS and read/write, and the generation of the required internal clocks. Upon receipt at the address port and latching in with the receipt of a row address strobe (RAS), a given row address is presented on internal row address bus 207. After the row address is latched in, a column address received at the address port is latched in with a column address strobe (CAS) and presented on internal column address bus 207.

Row address bus 207 is coupled to a first input of a row address multiplexer 208 and the data load input of a counter 209. A second input of row multiplexer 208 is coupled to the output of row address counter 209. As will be discussed further below, row address counter 209 loads an initial row address and increments therefrom in response to clock signal ROWINC to generate a sequence of row addresses. Each data bank 201 is associated with a row line (wordline) decoder 210. In the preferred embodiment, wordline decoder 210a selects for access a row in bank 201a in response to an even address output from row address multiplexer 208 and wordline decoder 210b selects for access a row in bank 201b in response to an odd address output from multiplexer 208.

Column address bus 207 is coupled to a first input of a column address multiplexer 211 and the data load input of a counter 212. As will be discussed below, column address counter 212 loads an initial address and increments therefrom in response to each falling edge of CAS (or alternatively a clock signal generated from CAS) to generate a sequence of column addresses. The output of column address multiplexer 211 is coupled to the column decoders/sense amplifier circuitry 213a and 213b associated with banks 201a and 201b respectively. In the preferred embodiment, both column decoders 213a and 213b respond to each address output from column address multiplexer 211. Column address decoders/sense amplifiers 213 and column lines 204 provide the access paths to the selected cells in banks 201.

In the preferred embodiment, the sense amplifiers within column decoder/sense amplifier circuits 213 are conventional sense amplifiers which refresh each cell at the intersection of an activated (selected) wordline 203 and a selected bitline 204 (precharged during a read or refresh). If approximately 0 volts is stored on the capacitor of such a selected cell 202, then during a read or refresh cycle that capacitor is coupled to the associated bitline 204 and charged by the charge held by the capacitance on that precharged bitline 204. Consequently the bitline voltage is pulled down. The sense amplifier coupled to that bitline 204 senses this drop in voltage and outputs approximately 0 volts. The 0 volts output from the sense amplifier is impressed on the bitline 204 to restore (refresh) the charge on the capacitor of the selected cell 204 to approximately zero volts. If the capacitor of the selected cell 202 is instead storing a positive voltage, the charge stored in the capacitor is coupled to the associated bitline during a read/refresh operation and consequently the voltage on the bitline increases. The associated sense amplifier senses the slight change in voltage on the bitline 204 and outputs a corresponding high voltage. This high voltage is impressed on the selected bitline 204 to fully restore (refresh) the voltage on the capacitor of the selected cell 202.

Input/output multiplexer 214 controls the exchange of data between control circuitry 205 and the column decoders/sense amplifiers 213a and 213b in response to the output from row address multiplexer 208. In the preferred embodiment, I/O multiplexer 214 allows access to the addressed cells in bank 201a (through column decoder/sense amplifiers 213a) in response to even row addresses and access to the addressed cells in bank 201b in response to odd row addresses.

Row address multiplexer 208 and column address multiplexer 211 are switched in response to control signals by multiplexer control circuitry 215. A mode select signal received through control circuitry 205 determines whether memory 200 is operating in a conventional random access mode or in a page (burst) mode. In the random access mode, row address multiplexer 208 and column address multiplexer 211 always switched to pass addresses presented on row and column address buses 206 and 207 to row and column decoders 210 and 211. In the page mode, row address multiplexer 208 passes the initial row address presented on row address bus 206 and thereafter is switched by multiplexer control circuitry 215 such that the next row addresses of a given sequence of row addresses are passed from row counter 209 (the first address output from row counter 209 is the initial row address loaded therein incremented by one). Similarly, column address multiplexer 211 in the page mode passes an initial column address presented on column address bus 207 and is thereafter switched by multiplexer control circuitry 215 such that the following column addresses in a given sequence of column addresses are passed from column counter 212 (the first address output from column address counter 212 is the initial column address loaded therein incremented by one).

Multiplexer control circuitry 215 also receives row and column stop addresses from control circuitry 205 via bus 216. In the page mode, these stop addresses designate the address of the last row and the last column to be accessed. In the preferred embodiment, the row and column stop addresses are received in serial at the address input port following receipt of the initial row and column addresses. As discussed further below, the stop addresses are latched in (multiplexed) in response to CAS and a stop address strobe (SAS). Multiplexer control circuitry 215 compares the received row and column stop addresses with the respective current addresses being output from row counter 209 and column counter 212. When the count in column counter 212 equals the column stop address, the last cell along the address row has been addressed and upon the next falling edge of CAS after access to that cell is complete, ROWINC goes active to increment the row address in row counter 209. Completion of access to a given cell, such as the last cell in a row, may be determined by monitoring the latching of the corresponding data in either control circuitry 205 and/or I/O MUX 214. Column counter 212 then returns to the initial column address either by resetting or by wrapping-around. Row counter 209 increments with each active period of ROWINC until the count therein equals the row stop address latched into control circuitry 205. Once access to the last selected cell in the last selected row is complete (i.e., the current counts in both counter 209 and 212 respectively equal the latched in row and column stop addresses and access to the correspondingly addressed cell 201 is complete) the entire burst access cycle is complete. Row and column address multiplexers 208 and 211 switch to await new initial addresses on buses 206 and 207.

For a complete description of the operation of memory system 200, reference is now made to copending and coassigned patent application Ser. No. 08/291;093; filed concurrently herewith and incorporated by reference.

According to the principles of the present invention, a refresh enable circuitry 217 selectively couples the row addresses output from row address multiplexer 208 to the input of bank 1 row decoder 210b. Refresh enable circuitry 217 is enabled in the refresh mode by a self refresh enable signal SREN received from control circuitry 205 via bus 218. In the preferred embodiment, row address counter 209 counts by two in the refresh mode such that only even addresses (normally only activating bank 0 row decoder 210a) are output from row multiplexer 211. At the same time, self refresh circuitry 217 adds one to the initial address to provide odd addresses to bank 201b (bank 1) thereby allowing simultaneous access to the corresponding wordlines of odd bank 201b (bank 1) during refresh. Column decoders 213 are deactivated in the refresh mode; the bitlines are precharged during RAS high. All the cells along each activated (selected) pair of wordlines 203 (one in bank 201a and one in bank 201b) are refreshed in the conventional manner discussed above. Row address counter 209 continues to increment by two, generating a sequence of addresses, until the row stop address is reached or the last rows in banks 201 are reached.

Figure 3:
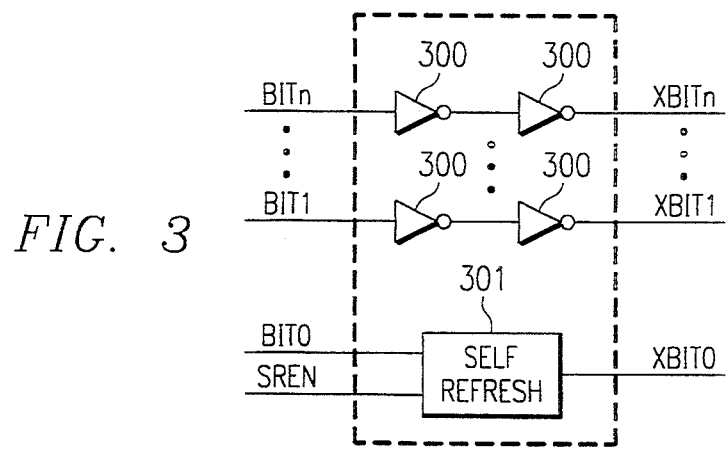
FIG. 3 is a more detailed functional block diagram of the refresh enable circuitry depicted in FIG. 2.

FIG. 3 is a functional block diagram of refresh enable circuitry 217. Row address bit BIT0 and the self refresh enable signal are input into self refresh circuitry 301, a detailed schematic of which is given in FIG. 4. The remaining row address bits BIT1-BITn are each passed through delay circuitry which mimics the delay BIT0 is subject to while passing through circuitry 301. In the illustrated embodiment, the delay circuitry for each bit comprises a serially coupled pair of inverters 300. In alternate embodiments, other known means for introducing a predetermined amount of delay may be used.

Figure 4:
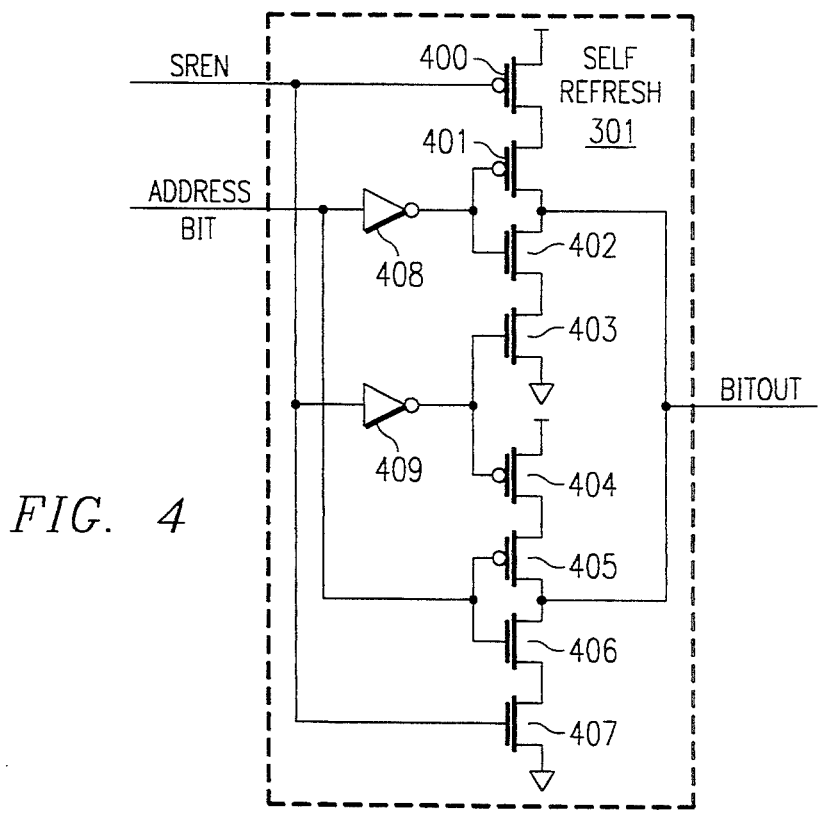
FIG. 4 is an electrical schematic diagram of the self refresh circuitry depicted in FIG. 3.

The preferred embodiment of refresh circuitry 301 depicted in FIG. 4 includes two sets of transistors, the first of which comprises transistor 400-403. P-channel transistor 400 includes a source/drain coupled to Vcc, a gate coupled to receive signal SREN, and another source/drain coupled to one source/drain of p-channel transistor 401. The gate of transistor 401 is coupled to receive row address bit BIT0 following inversion by inverter 408. The other source/drain of transistor 401 is coupled to a first source/drain of n-channel transistor 402, which has its gate coupled to the output of inverter 408. The other source/drain of transistor 402 is coupled to a first source/drain of n-channel transistor 403. The gate of transistor 403 is coupled to the output of an inverter 409, the input of which receives control signal SREN. The other source/drain of transistor 403 is coupled to $V_{ss}$ (0 volts) or ground.

The second set of transistors included in self refresh circuitry 301 comprises transistors 404-407. P-channel transistor 404 includes a source/drain coupled to Vcc, a gate coupled to receive signal SREN complement output from inverter 409, and another source/drain coupled to a first source/drain of p-channel transistor 405. The gate of transistor 405 is coupled to receive row address bit BIT0. The other source/drain of transistor 405 is coupled to one source/drain of n-channel transistor 406, which also has its gate coupled receive row address bit BIT0. The other source/drain of transistor 406 is coupled to a first source/drain of n-channel transistor 407. The gate of transistor 407 receives control signal SREN. The other source/drain of transistor 407 is coupled to $V_{ss}$ (0 volts) ground.

Refresh circuitry 301 converts the row address being provided to row address decoder 210b (bank 1) by reversing the polarity of BIT0 when signal SREN is active (high). When SREN is high and BIT0 is high, transistors 406 and 407 turn on and pull the output BITOUT low. When SREN is high and BIT0 is low, transistors 404 and 405 turn on and pull output BITOUT up to approximately Vcc.

When memory 200 is not in the refresh mode, SREN is low. When BIT0 is high in this mode transistors 400 and 401 are turned on and output BITOUT is pulled up to Vcc. When BIT0 is low, transistors 402 and 403 turn on pulling down output BITOUT to approximately 0 volts.

Although the present invention and its advantages have been described in detail, it should be understood that various changes, substitutions and alterations can be made herein without departing from the spirit and scope of the invention as defined by the appended claims.

What is claimed is:

1. Memory circuitry comprising:
   first and second banks of memory cells arranged in rows and columns;
   a first row decoder for selecting a said row in said first bank in response to a row address of a first group of row addresses;
   a second row decoder for selecting a said row in said second bank in response to a row address of a second group of row addresses;
   row address circuitry for presenting a sequence of said row addresses to said row decoders in response to a single row address received at an address port to said memory circuitry, said row address circuitry presenting only row addresses of said first group in a refresh mode; and refresh circuitry coupling said row address circuitry with said second row decoder, said refresh circuitry in said refresh mode converting a said row address presented by row address circuitry in said first group into a said address in said second group for use by said second row decoder.

2. The memory of claim 1 wherein said refresh circuitry converts a said address of said first group to a said address of said second group by inverting a selected bit of said address of said first group.

3. The memory of claim 2 wherein said refresh circuitry inverts a least significant bit of said address of said first group.

4. The memory of claim 1 wherein said row addresses of said first group comprise even addresses and said row addresses of said second group comprise odd addresses.

5. The memory of claim 1 wherein each said row address of said first group comprises a plurality of bits and said refresh circuitry comprises:
circuitry for inverting a selected one of said plurality of bits in response to a refresh enable signal; and
circuitry for delaying other ones of said bits, the delay mimicking a delay seen by said selected one of said bits.

6. The memory of claim 5 wherein said circuitry for inverting comprises:
a first transistor of a first type having a first source/drain coupled to a first voltage source and a gate coupled to receive a refresh enable signal;
a second transistor of said first type having a first source/drain coupled to a second source/drain of said first transistor and a gate coupled to receive an inverted row address bit from said row circuitry;
a third transistor of a second type having a first source/drain coupled to a second source/drain of said second transistor and a gate coupled to receive said inverted row address bit;
a fourth transistor of said second type having a first source/drain coupled to a second source/drain of said third transistor, a second source/drain coupled to a second voltage source, and a gate coupled to receive an inverted said refresh enable signal;
a fifth transistor of said first type having a first source/drain coupled to said first voltage source and a gate coupled to receive said inverted refresh enable signal;
a sixth transistor of said first type having a first source/drain coupled to a second source/drain of said fifth transistor and a gate coupled to received said address bit;
a seventh transistor of said second type having a first source/drain coupled to a second source/drain of said sixth transistor and a gate coupled to receive said address bit;
an eighth transistor of said second type having a first source/drain coupled to a second source/drain of said seventh transistor, a second source/drain coupled to said second voltage source, and a gate coupled to receive said refresh enable signal; and
wherein said first source/drain of said third transistor and said first source/drain of said seventh transistor are coupled to an output of said refresh circuitry.

7. The memory of claim 6 wherein said transistors of said first type comprise p-channel field effect transistors and said transistors of said second type comprise n-channel field effect transistors.

8. The memory circuitry of claim 1 and further comprising:
column decoder circuitry for selecting a said columns in each of said banks in response to a column address, said column decoder deactivated in said refresh mode;
a column address counter for generating a sequence of said column addresses per each said row address by incrementing from a first column address to a last column address in response to clock signal; and
multiplexer circuitry for presenting to said column decoders an initial column address received from said column address bus and thereafter at least a first column address provided by said column address counter.

9. The memory of claim 1 wherein said row address circuitry comprises:
a row address counter for generating a sequence of said row addresses by incrementing from a first row address to a last row address following access to a said cell in a column corresponding to a said last column address;
multiplexer circuitry for presenting to said row decoders an initial row address received from said row address bus and thereafter at least a first row address provided by said row address counter.

10. The memory of claim 9 wherein said row address counter increments by two in said refresh mode.

11. Memory circuitry comprising:
first and second banks of memory cells arranged in rows and columns, each said row associated with a wordline conductor and each said column associated with a bitline conductor;
a first row decoder coupled to said wordlines of said first bank for selecting a said row in said first bank in response to a row address of a first group of row addresses;
a second row decoder coupled to said wordlines of said second bank for selecting a said row in said second bank in response to a row address of a second group of row addresses;
column decoder circuitry coupled to said bitlines for selecting a said column in at least one of said banks in response to a column address in a read/write mode, said column decoder circuitry deactivated in a refresh mode;
sense amplifier circuitry coupled to said bitlines of said first and second banks for reading a said cell at a selected said row and a selected said column refresh said cells along a selected said row in said refresh mode;
circuitry for precharging all said bitlines during said refresh mode;
a column address counter for generating a sequence of said column addresses per each said row address by incrementing from a first column address to a last column address in response to clock signal;
column address multiplexer circuitry for presenting to said column decoders an initial column address received from a column address bus and thereafter at least a first column address provided by said column address counter;
a row address counter for generating a sequence of said row addresses by incrementing by one in said read/write mode from a first row address to a last row address following access to a said cell in a column corresponding to a said last column address and in said refresh mode by two from said first row address to said last row address to generate a sequence of row addresses from said first group;

row address multiplexer circuitry for presenting to said row decoders an initial row address received from a row address bus and thereafter at least a first row address provided by said row address counter; and refresh circuitry coupling said row multiplexer with said second row decoder, said refresh circuitry in said refresh mode converting a said address in said first group into a said address in said second group.

12. The memory of claim 11 wherein said first group of addresses is comprised of even addresses and said second group of addresses is comprised of odd addresses.

13. The memory of claim 11 wherein said refresh circuitry is operable to invert a selected bit of each said row address presented by said row address counter to said second row decoder in response to a refresh control signal.

14. The memory of claim 11 wherein said refresh circuitry comprises:

a first p-channel transistor having a first source/drain coupled to a first voltage source and a gate coupled to receive a refresh enable signal;

a second p-channel transistor having a first source/drain coupled to a second source/drain of said first n-channel transistor and a gate coupled to receive an inverted said selected row address bit from said row circuitry;

a first n-channel transistor having a first source/drain coupled to a second source/drain of said second p-channel transistor and a gate coupled to receive said inverted row address bit;

a second n-channel transistor having a first source/drain coupled to a second source/drain of said first n-channel transistor, a second source/drain coupled to a second voltage source, and a gate coupled to receive an inverted said refresh enable signal;

a third p-channel transistor having a first source/drain coupled to said first voltage source and a gate coupled to receive said inverted refresh enable signal;

a fourth p-channel transistor having a first source/drain coupled to a second source/drain of said fifth transistor and a gate coupled to received said address bit;

a third n-channel transistor having a first source/drain coupled to a second source/drain of said sixth transistor and a gate coupled to receive said address bit;

a fourth n-channel transistor having a first source/drain coupled to a second source/drain of said seventh transistor, a second source/drain coupled to said second voltage source, and a gate coupled to receive said refresh enable signal; and wherein said first source/drain of said third transistor and said first source/drain of said seventh transistor are coupled to an output of said refresh circuitry.

15. The circuitry of claim 14 wherein said refresh circuitry further comprises delay circuitry operable to delay other bits of each said row address presented to said second decoder by an amount approximately seen by said selected bit.

16. A memory comprising:

first and second banks of memory cells arranged in rows and columns, each said row associated with a wordline conductor and each said column associated with a bitline conductor;

a first row decoder coupled to said wordlines of said first bank for selecting a said row in said first bank in response to a row address from a first group of row addresses; and a second row decoder coupled to said wordlines of said second bank for selecting a said row in said second bank in response to a row address from a second group of row addresses;

a row address counter for generating a sequence of row refresh addresses of said first group for presentation to said row decoders by incrementing in said refresh mode by two from a first said row address to a last said row address;

refresh circuitry operable in said refresh mode to convert a said address in said first group into a said address in said second group for use by said second row decoder by inverting a selected bit in said address; and circuitry for refreshing a cell along a selected said wordline and a precharged said bitline.

17. The memory of claim 16 wherein said selected bit comprises a least significant bit of said address of said first group.

18. The memory of claim 16 wherein said refresh circuitry comprises:

a first transistor of a first type having a first source/drain coupled to a first voltage source and a gate coupled to receive a refresh enable signal;

a second transistor of said first type having a first source/drain coupled to a second source/drain of said first transistor and a gate coupled to receive an inverted row address bit from said row circuitry;

a third transistor of a second type having a first source/drain coupled to a second source/drain of said second transistor and a gate coupled to receive said inverted row address bit;

a fourth transistor of said second type having a first source/drain coupled to a second source/drain of said third transistor, a second source/drain coupled to a second voltage source, and a gate coupled to receive an inverted said refresh enable signal;

a fifth transistor of said first type having a first source/drain coupled to said first voltage source and a gate coupled to receive said inverted refresh enable signal;

a sixth transistor of said first type having a first source/drain coupled to a second source/drain of said fifth transistor and a gate coupled to received said address bit;

a seventh transistor of said second type having a first source/drain coupled to a second source/drain of said sixth transistor and a gate coupled to receive said address bit;

an eighth transistor of said second type having a first source/drain coupled to a second source/drain of said seventh transistor, a second source/drain coupled to said second voltage source, and a gate coupled to receive said refresh enable signal; and wherein said first source/drain of said third transistor and said first source/drain of said seventh transistor are coupled to an output of said refresh circuitry.

19. The memory of claim 18 wherein said transistors of said first type comprise p-channel field effect transistors and said transistors of said second type comprise n-channel field effect transistors.

20. The memory of claim 16 and further comprising:
column decoder circuitry for selecting a said columns in each of said banks in response to a column address, said column decoder deactivated in said refresh mode;
a column address counter for generating a sequence of said column addresses per each said row address by incrementing from a first column address to a last column address in response to clock signal; and
multiplexer circuitry for presenting to said column decoders an initial column address received from said column address bus and thereafter at least a first column address provided by said column address counter.

* * * * *